(12) United States Patent
Grund et al.

(10) Patent No.: US 11,148,258 B2
(45) Date of Patent: Oct. 19, 2021

(54) HOLDING APPARATUS AND METHOD FOR HOLDING A SUBSTRATE

(71) Applicant: SUSS MicroTec Lithography GmbH, Garching (DE)

(72) Inventors: Thomas Grund, Garching (DE); Rainer Targus, Garching (DE)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 284 days.

(21) Appl. No.: 16/420,993

(22) Filed: May 23, 2019

(65) Prior Publication Data

US 2019/0366517 A1    Dec. 5, 2019

(30) Foreign Application Priority Data

May 29, 2018   (NL) ..................................... 2021006

(51) Int. Cl.
*B25B 11/00*   (2006.01)
*H01L 21/683*  (2006.01)

(52) U.S. Cl.
CPC ........ *B25B 11/005* (2013.01); *H01L 21/6838* (2013.01)

(58) Field of Classification Search
CPC ..................................................... B25B 11/005
USPC ............................................................. 269/21
See application file for complete search history.

(56) References Cited

U.S. PATENT DOCUMENTS

| 5,842,690 A * | 12/1998 | Lee ......................... B25B 5/163 |
| | | 269/21 |
| 7,834,982 B2 * | 11/2010 | Yamamoto .............. G03F 7/707 |
| | | 355/72 |
| 2020/0114525 A1 * | 4/2020 | Wada ................... B25J 15/0616 |

FOREIGN PATENT DOCUMENTS

| JP | H1086086 A | * | 9/1996 |
| JP | 3782523 B2 | | 6/2006 |
| JP | 2012146783 A | | 8/2012 |
| JP | 2013135024 A | | 7/2013 |

* cited by examiner

*Primary Examiner* — Lee D Wilson
*Assistant Examiner* — Jonathan G Santiago Martinez
(74) *Attorney, Agent, or Firm* — Hayes Soloway PC

(57) ABSTRACT

A holding apparatus, in particular a chuck, for a substrate comprises a main body with a upper side, a carrier element arranged in a recess of the main body so as to be vertically movable such that it can be adjusted between a protruding loading position and a retracted clamping position, the carrier element comprising a support surface for placement of the substrate. The support surface has a smaller diameter than the main body. A lifting element lifts the carrier element to the loading position. The carrier element seals the recess such that a sealed cavity is provided between the main body and the carrier element, which cavity can have a negative pressure applied thereto which counteracts the effect of the lifting element.

12 Claims, 5 Drawing Sheets

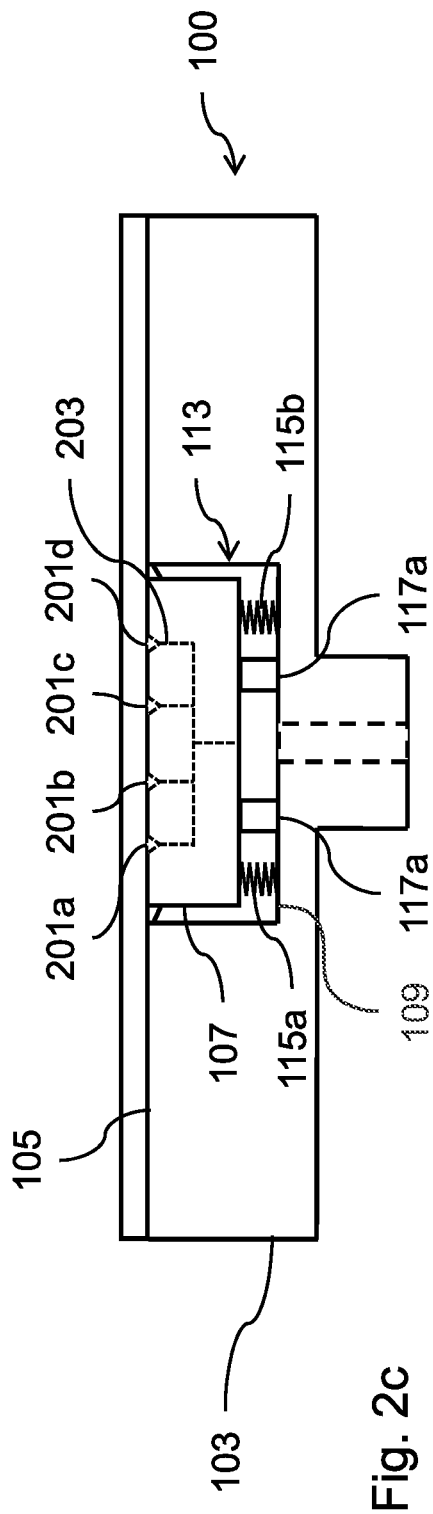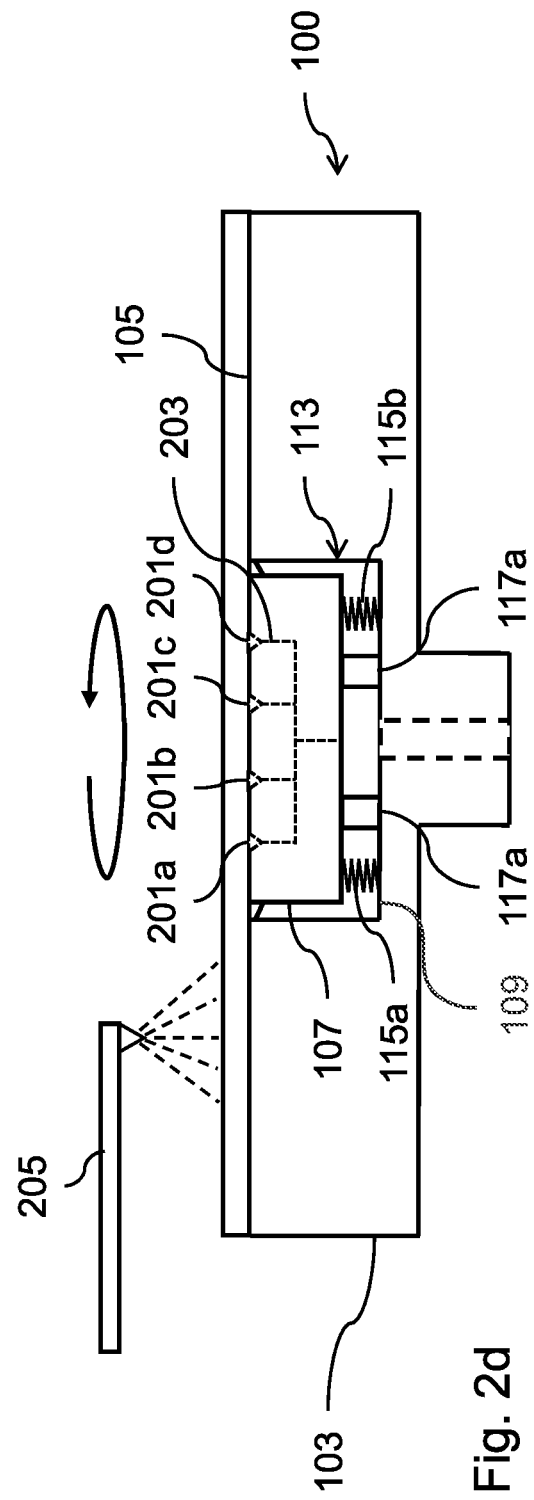

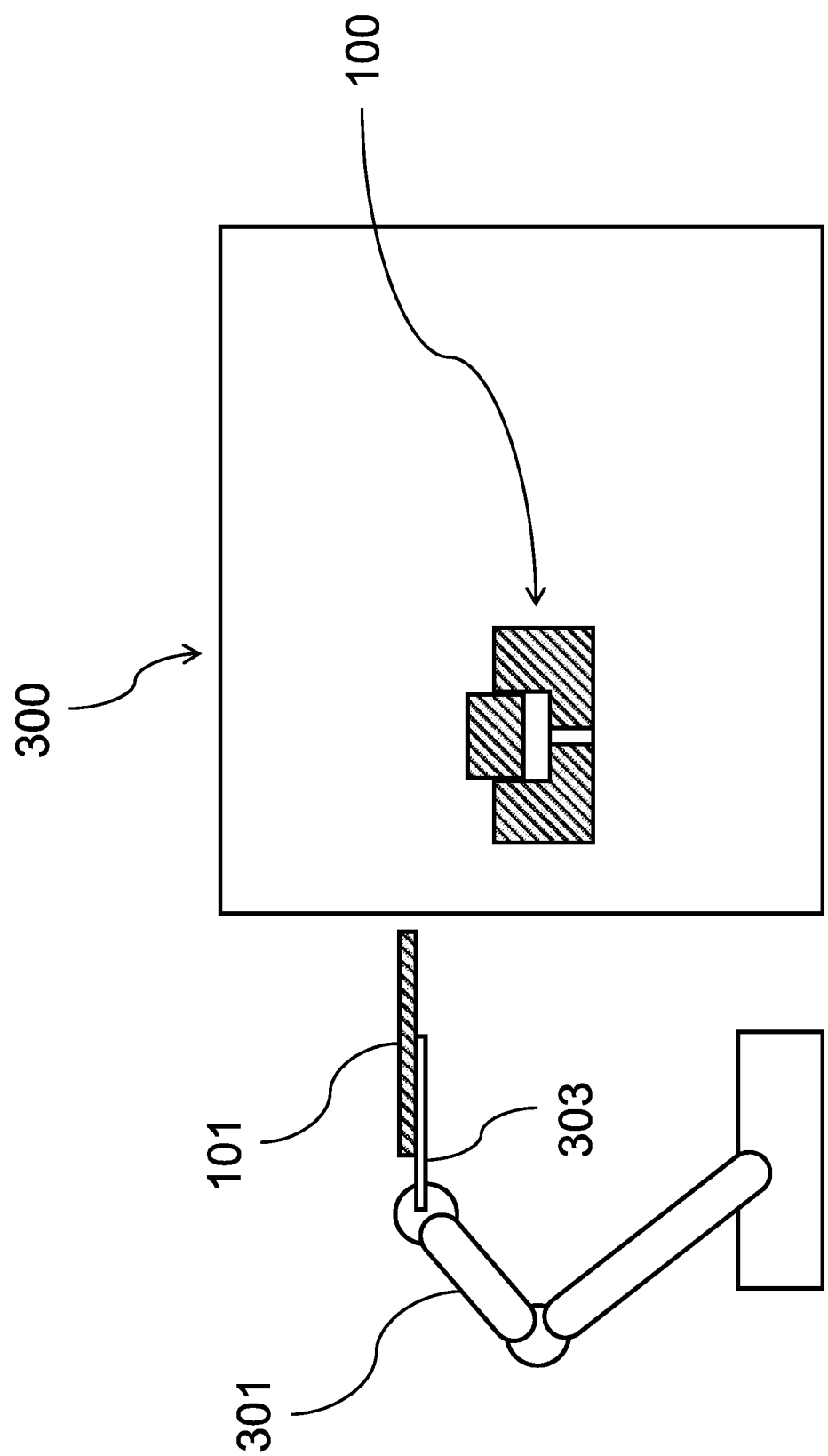

HOLDING APPARATUS AND METHOD FOR HOLDING A SUBSTRATE

CROSS-REFERENCE TO RELATED APPLICATIONS AND PRIORITY

This patent application claims priority from NL Patent Application No. 2021006 filed May 29, 2018, which is herein incorporated by reference in its entirety.

FIELD OF THE INVENTION

The present invention relates to the field of holding and fixing substrates, in particular in manufacturing equipments for microstructure devices.

BACKGROUND OF THE INVENTION

Substrates, such as semiconductor wafers, are processed in special manufacturing equipments for microstructure devices, e.g. in coating equipments (coaters). In particular, substrate holders, so-called chucks, are frequently used in order to hold the substrates in these equipments. Frequently, they are spinner chucks which rotate the substrates at a high rotational speed, e.g. in order to coat the substrates uniformly. The substrates are fixed on the chuck, e.g. by means of vacuum suction.

The substrates processed in this manner are mostly flat and planar. However, they can also deviate from an ideally planar shape and have a bow. Bowed wafers are defined e.g. as warped wafers. It is difficult to fix bent substrates on spinner chucks by means of vacuum suction because no vacuum or only an insufficient vacuum can be established between the chuck upper side and the substrate lower side on account of the bow.

In order to improve the fixing of bowed substrates, it is known to arrange soft sealing lips on the support surface of the chuck. The substrate is supported on the periphery of the sealing lip so that a vacuum can be established between the substrate and chuck.

However, in this case it is disadvantageous that the substrate is not guided horizontally during the suction process. When the air is being evacuated, the substrate can laterally slide or float within the holding surface and a resulting vertical movement until finally it is supported in a planar manner on the chuck. This adversely affects the centring of the substrate with respect to the chuck, which in the subsequent course of the process can result in undesired effects, such as vibrations or a non-homogeneous, i.e. fluctuating along the periphery, edge bead removal (EBR).

Further disadvantages arise as a result of soiling and ageing of the sealing lips. The sealing lips can generate particles and change their surface and friction properties over time. This can result in specifically increased maintenance outlay, e.g. arising from replacement of the sealing lips, correction of the storage position or cleaning of the sealing lips.

Therefore, it is the object of the present invention to hold and fix a substrate, in particular a bowed substrate, efficiently and securely.

BRIEF DESCRIPTION OF THE INVENTION

This object is achieved by the features of the independent claims. Advantageous developments are the subject matter of the dependent claims, the description and the drawings.

According to a first aspect, the invention relates to a holding apparatus, in particular a chuck, for a substrate, comprising a main body with a upper side, a carrier element, wherein the carrier element is arranged in a recess of the main body so as to be vertically movable such that it can be adjusted between a protruding loading position and a retracted clamping position, and wherein the carrier element comprises a support surface for placement of the substrate, wherein the support surface has a smaller diameter than the main body, and a lifting element which lifts the carrier element to the loading position, wherein the carrier element seals the recess such that a sealed cavity is provided between the main body and the carrier element, which cavity can have a negative pressure applied thereto which counteracts the effect of the lifting element. This provides the advantage that substrates, to which suction cannot readily be applied, in particular bowed wafers (warped wafers), can be held securely and guided in the vertical movement by reason of the initially small vacuum surface.

The small size of the support surface of the carrier element means that in the loading position sufficient sealing can be achieved in order to fix a bowed wafer initially on the carrier element. Subsequently, the substrate can be pulled in the clamping position against the upper side of the main body and finally can be firmly clamped.

The upper side of the main body can correspond to a clamping surface for the substrate, on which the substrate is firmly clamped in the clamping position.

In this case, a vertical movement refers to a movement coaxial to a transverse axis of the main body. In particular, this means a movement perpendicular to the support surface of the carrier element.

The diameter of the carrier element is e.g. less than half, a third or a quarter of the diameter of the substrate and/or the diameter of the main body. In particular, in the case of significantly bowed substrates, it is advantageous for the diameter of the carrier element to be as small as possible in order to generate sufficient vacuum suction in the loading position.

The carrier element can be arranged so as to be movable in the recess in the manner of piston.

The recess can be a depression in the main body, in particular along a central axis of the main body. The recess can have a circular diameter. The diameter of the recess can correspond to, or can be minimally larger than, the diameter of the carrier element.

The cavity can be the space which remains between the bottom of the recess and the carrier element. The size of cavity can be defined by the position of the carrier element and can vary with the movement of the carrier element.

The substrate can be a wafer. The substrate can be disk-shaped. The substrate can have a largely round periphery with a diameter of 2, 3, 4, 5, 6, 8, 12 or 18 inches. Furthermore, the substrate can be largely flat and can have a thickness between 50 and 4000 µm. The substrate can have a straight edge (flat) and/or can have at least one notch. Furthermore, the substrate can be angular, in particular square or rectangular.

The substrate can be formed from a semiconductor material, e.g. silicon (Si) or gallium arsenide (GaAs), a glass, e.g. quartz glass, a synthetic material or a ceramic. The substrate can be formed from a monocrystalline, a polycrystalline or an amorphous material. Furthermore, the substrate can comprise a multiplicity of associated materials.

The substrate can comprise electric circuits, e.g. transistors, light-emitting diodes or photodetectors, electric conductive tracks which connect these circuits, or optical devices as well as MEMS or MOEMS structures. Furthermore, the substrate can have coatings, e.g. structured chromium layers, pre-cross-linked or hardened bond adhesives or separation layers.

According to one embodiment, spacers are provided which define the clamping position of the carrier element in which the support surface of the carrier element is arranged substantially flush with the upper side of the main body. This provides the advantage that the position of the carrier element can be fixed in the clamping position such that the support surface and the upper side of the main body form a common support for the substrate, on which the substrate can be clamped in the clamping position.

Preferably, a height deviation between the support surface of the carrier element and the upper side of the main body after lowering is less than a height fluctuation of the substrate by reason of a deformation or bow. Particularly preferably, the height deviation is less than a substrate thickness.

According to one embodiment, the main body comprises a sealing means, in particular a sealing lip, which surrounds the carrier element with a spaced interval and can seal between the upper side of the main body and the substrate. This provides the advantage that in the clamping position the substrate can be subjected to suction and clamped in a particularly efficient manner. With the aid of the sealing means, a vacuum can be produced underneath the substrate which exerts a uniform force upon the substrate and clamps it.

According to one embodiment, the carrier element is provided with a seal which seals against the lateral wall of the recess in the main body. This provides the advantage that the sealing-tightness of the cavity and the frictionless movement of the carrier element in the recess can be ensured.

According to one embodiment, the carrier element comprises fixing means for fixing the substrate supported on the support surface, in particular suction openings. This provides the advantage that the substrate can be securely fixed on the support surface.

According to one embodiment, the main body has further fixing means for fixing the lowered substrate on the upper side. The further fixing means can comprise further suction openings.

According to one embodiment, the cavity and the fixing means are fluidically connected. This provides the advantage of permitting a particularly simple construction and control of the holding apparatus. For example, an individual pressure supply is sufficient in order to control the fixing of the substrate and the lowering of the carrier element.

According to one embodiment, the holding apparatus has a pressure connection, by means of which the pressure in the cavity can be controlled. This provides the advantage of permitting control of the functions of the carrier element by means of the application of pressure, e.g. via an external pressure supply.

According to one embodiment, the lifting element comprises a clamping element, in particular a compression spring, which is designed to exert a force upon the carrier element in order to raise it.

The lifting element generates a force upon the carrier element, which counteracts the pulling force generated by the negative pressure in the cavity. The lifting element, in particular the clamping element, can be arranged between the main body and the carrier element, in particular in the recess of the main body.

Furthermore, the holding apparatus can comprise a stop, wherein the lifting element is designed to urge the carrier element against the stop. The stop defines e.g. the loading position of the carrier element and prevents the carrier element from sliding out of the recess.

According to one embodiment, the holding apparatus comprises a rotating apparatus for rotating the holding apparatus, in particular the main body and the carrier element. This provides the advantage that a substrate which is held particularly securely by the holding apparatus can be rotated for further processing steps, such as the application of coatings.

According to a second aspect, the invention relates to a manufacturing equipment for microstructure devices, which comprises a holding apparatus as claimed in any one of the preceding claims. This provides the advantage that substrates, to which suction cannot readily be applied, in particular bowed wafers (warped wafers), can be efficiently and securely held and processed in the manufacturing equipment.

The manufacturing equipment can be a coater, a lacquerer, a developer, a spin dryer, a mask aligner, a projection scanner, a laser stepper, a wafer bonder, a photomask system, a cleaning system or an imprint system.

According to a third aspect, the invention relates to a method for holding a substrate in a holding apparatus comprising a main body and a carrier element, wherein the method comprises the following method steps: raising the carrier element to a loading position, wherein the carrier element has a smaller diameter than the substrate, placing the substrate onto a support surface of the carrier element, fixing the substrate on the support surface and lowering the carrier element to a clamping position in which the support surface of the carrier element is arranged substantially flush with an upper side of the main body. This provides the advantage that substrates, to which suction cannot readily be applied, in particular bowed wafers (warped wafers), can be held securely and guided in the vertical movement by reason of the initially small vacuum surface.

The diameter of the carrier element is e.g. less than half, a third or a quarter of the diameter of the substrate and/or the diameter of the main body. In particular, in the case of significantly bowed substrates, it is advantageous for the diameter of the carrier element to be as small as possible in order to generate sufficient vacuum suction in the loading position.

The small diameter in comparison with the wafer size results in a vacuum surface, which is initially smaller and easier to seal, to apply suction to the wafer in the loading position. In particular, in the case of a bowed wafer, the suction is simplified by the smaller vacuum surface. Subsequently, the substrate is pulled against the upper side of the main body where finally it can be firmly clamped over its entire surface in the clamping position.

According to one embodiment, in order to fix the substrate on the support surface a first negative pressure is applied to a cavity of the holding apparatus, and in order to lower the carrier element to the clamping position a second negative pressure is applied to the cavity, wherein the second negative pressure is a lower pressure than the first negative pressure. This provides the advantage that the control of the holding apparatus, in particular the fixing of the substrate and the movement of the carrier element, can be effected by means of a single pressure connection. By virtue of the change in the negative pressure, the substrate can initially be preliminarily fixed, then the carrier element can be adjusted and then the substrate can be finally fixed.

According to one embodiment, the placing of the substrate onto the support surface of the carrier element produces a pressure reduction in the cavity, in particular by means of the sealing of suction openings on the support surface, wherein the lowering of the carrier element to the clamping position is triggered and/or assisted by the pressure reduction. This provides the advantage of permitting particularly simple control of the holding apparatus because in particular a manual change in pressure is no longer required in order to lower the carrier element.

For example, in order to fix the substrate on the support surface the first negative pressure is initially applied to the cavity of the holding apparatus, and then the second negative pressure is applied in the cavity after the substrate is placed onto the carrier element, e.g. by the covering of suction openings on the support surface by the substrate.

According to one embodiment, the carrier element urges the substrate in the clamping position against the upper side of the main body, wherein a force exerted upon the substrate is of such a magnitude that possible bowing of the substrate is reduced. This provides the advantage that the bowed substrates can be smoothed out by the holding apparatus. As a result, further processing of the substrate, e.g. the application of a coating, can be simplified or even permitted. Furthermore, a smoothed-out substrate can be held in a more stable manner, in particular during rotation of the chuck.

The bowed substrate can be a so-called warped wafer. The bow can occur by reason of a smaller thickness of the substrate and/or by reason of internal stresses in the substrate.

According to one embodiment, the substrate is pulled against the upper side of the main body by means of a negative pressure acting between the substrate and the upper side. This provides the advantage that the substrate in the clamping position can be securely and firmly fixed on the upper side.

According to one embodiment, the method further comprises rotating the substrate, in particular after lowering the carrier element. This provides the advantage that the substrate which is held particularly securely in this manner can be rotated for further processing steps.

BRIEF DESCRIPTION OF THE DRAWINGS

Further exemplified embodiments are explained in greater detail with reference to the accompanying drawings. In the figures:

FIG. 2a-FIG. 2d shows schematic views of a holding apparatus during placement of a substrate;

FIG. 3 shows a schematic view of a manufacturing equipment for microstructure devices with a holding apparatus.

DETAILED DESCRIPTION OF THE INVENTION

Figure 1:
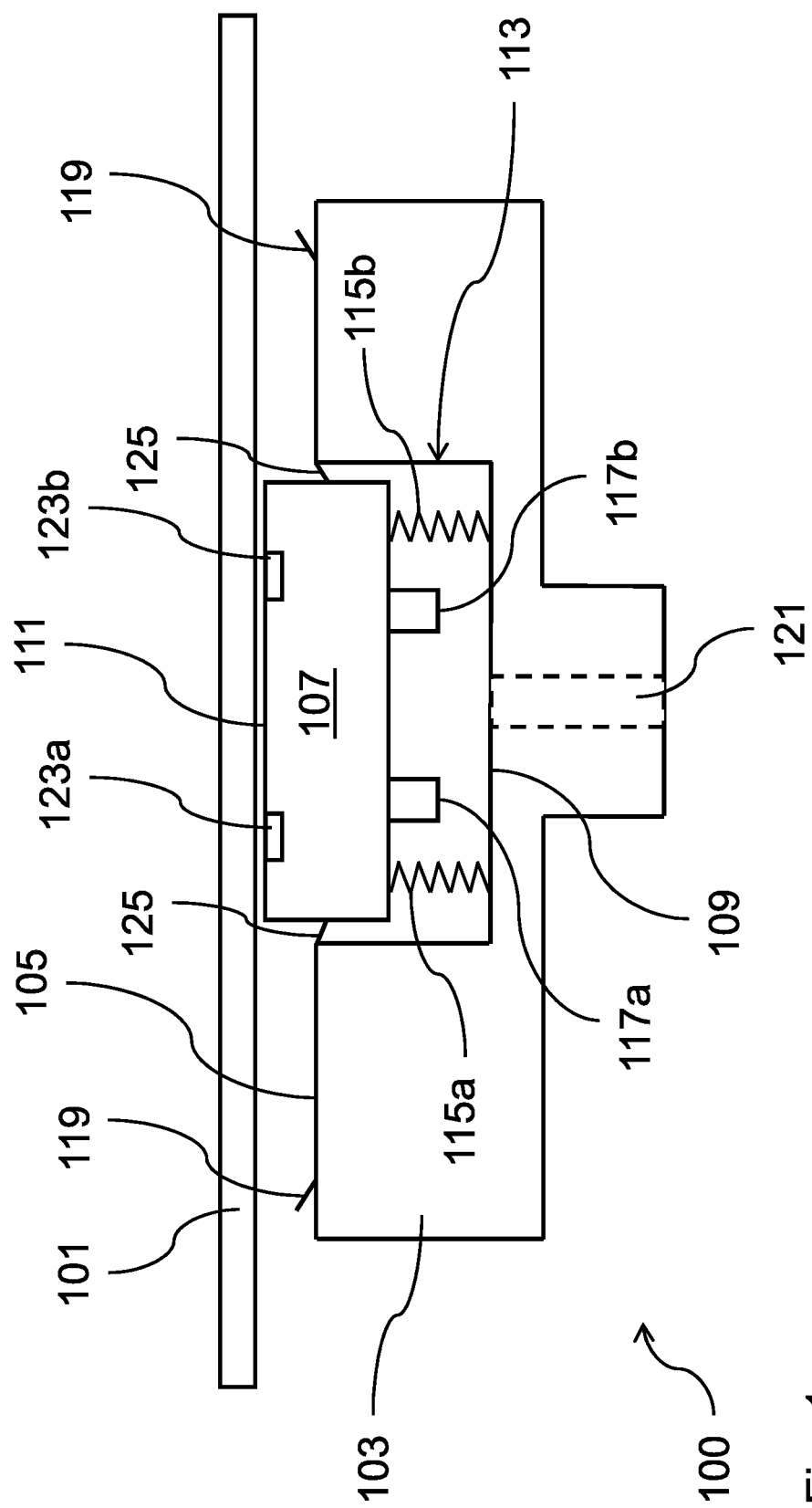
FIG. 1 shows a schematic view of a holding apparatus for a substrate.

FIG. 1 shows a schematic view of a holding apparatus 100 for a substrate 101 according to one embodiment.

The holding apparatus 100 comprises a main body 103 having an upper side 105, a carrier element 107 which is arranged in a recess 109 of the main body 103 so as to be vertically movable such that it can be adjusted between a protruding loading position and a retracted clamping position, wherein the carrier element 107 comprises a support surface 111 for placement of the substrate 101, wherein the support surface 111 has a smaller diameter than the main body 103. Furthermore, the holding apparatus 100 comprises a lifting element which raises the carrier element 107 to the loading position.

The carrier element 107 seals the recess 109 such that a sealed cavity 113 is provided between the main body 103 and the carrier element 107, which cavity can have a negative pressure applied thereto which counteracts the effect of the lifting element.

The upper side 105 of the main body 103 can correspond to a clamping surface for the substrate 101, on which the substrate 101 is firmly clamped in the clamping position.

The carrier element 107 can be received in the recess 109 in such a manner as to be adjustable in the manner of a piston. By applying a negative pressure to the sealed cavity, the carrier element 107 can be moved from the loading position to the clamping position.

The cavity is the space which remains between the bottom of the recess 109 and the carrier element 101. Therefore, the size of the cavity can be changed with the position of the carrier element 101 and is dependent thereupon.

In an alternative embodiment, the cavity 113 can also be formed by further bores or fluid lines in the main body 103.

In the embodiment shown, the lifting element is formed by two clamping elements 115a, 115b in the form of compression springs which are arranged in the recess 109 of the main body 103, and exert a pushing force upon the carrier element.

In the embodiment shown in FIG. 1, a sealing means 119 is arranged on the surface of the main body. The sealing means 119 can improve vacuum suction of the substrate 101 on the support surface 111 and/or the upper-side surface 105 of the main body 103 in the clamping position. In particular, the sealing means 119 enables a vacuum to be established over a large surface between the substrate 101 and the holding apparatus 100.

The substrate 101 can be a wafer. The substrate 101 can be disk-shaped. The substrate 101 can have a largely round periphery with a diameter of 2, 3, 4, 5, 6, 8, 12 or 18 inches. Furthermore, the substrate 101 can be largely flat and can have a thickness between 50 and 4000 µm. The substrate 101 can have a straight edge (flat) and/or can have at least one notch. Furthermore, the substrate 101 can be angular, in particular square or rectangular.

The substrate 101 can be formed from a semiconductor material, e.g. silicon (Si) or gallium arsenide (GaAs), a glass, e.g. quartz glass, a synthetic material or a ceramic. The substrate can be formed from a monocrystalline, a polycrystalline or an amorphous material. Furthermore, the substrate 101 can comprise a multiplicity of associated materials.

The substrate 101 can comprise electric circuits, e.g. transistors, light-emitting diodes or photodetectors, electric conductive tracks which connect these circuits, or optical devices as well as MEMS or MOEMS structures. Furthermore, the substrate 101 can have coatings, e.g. structured chromium layers, pre-cross-linked or hardened bond adhesives or separation layers.

Furthermore, the holding apparatus 100 comprises a seal 125 which seals against the lateral wall of the recess 109 in the main body 103. The seal 125 can be an O-ring or a sealing lip.

Furthermore, the carrier element 107 has spacers 117a, 117b, e.g. in the form of pins, on its lower side.

The spacers 117a, 117b can be used to define a lowering depth of the carrier element 107 into the recess 109 and to ensure that the support surface 111 of the carrier element 107 in the clamping position is arranged substantially flush with the upper side 105 of the main body 103. Furthermore, the spacers 117*a*, 117*b* can prevent the carrier element 107 from being lowered completely into the recess and thus ensure a minimum size of the cavity 113.

In the embodiment shown in FIG. 1, the carrier element 107 also has fixing means 123*a*, 123*b* for fixing the substrate supported on the support surface. The fixing means 123*a*, 123*b* can be suction openings. Furthermore, the fixing means 123*a*, 123*b* can comprise a vacuum bore or vacuum grooves.

The main body 103 comprises a fluid channel 121 for applying pressure to the cavity 113.

The fluid channel 121 can be a bore, in particular a central bore, in the main body 113 which issues in the recess 109 or the cavity 113 formed by the recess 109.

According to one embodiment, the holding apparatus 100 has a pressure connection, not shown in FIG. 1, by means of which the pressure in the cavity 113 can be controlled. The fluid channel 121 can connect the cavity 113 fluidically to the pressure connection. When the negative pressure is applied to the cavity 113, the cavity consequently also lies against the fixing means 123*a*, 123*b*, whereby said fixing means can apply suction to the substrate 101.

Furthermore, the holding apparatus 100 can comprises a stop, against which the carrier element 107 is urged in the loading position. Therefore, the stop can be used to define the position of the carrier element 107 in the loading position. The stop can be used, as it were, to prevent the carrier element 107 from sliding out of the recess 109.

FIG. 2*a*-FIG. 2*d* shows schematic views of the holding apparatus 100 during placement of a substrate 101 according to a further embodiment.

The carrier element 107 of the holding apparatus 100 in FIG. 2*a*-FIG. 2*d* comprises four suction openings 201*a*, 201*b*, 201*c*, 201*d*. The suction openings 201*a*, 201*b*, 201*c*, 201*d* form the fixing means for fixing the substrate 101 on the support surface 111.

The suction openings 201*a*, 201*b*, 201*c*, 201*d* are connected fluidically to the cavity 113 via a fluid channel 203.

The holding apparatus 100 in FIG. 2*a*-FIG. 2*d* can comprise a rotating apparatus, not shown. In particular, the holding apparatus 100 is a spinner chuck, in which a vacuum is maintained in a hollow shaft of the motor with respect to the chuck 100 or with respect to the cavity 103 in order, on the one hand, to apply suction to the substrate 101 and, on the other hand, to adjust the position of the carrier element 107.

Figure 2A:
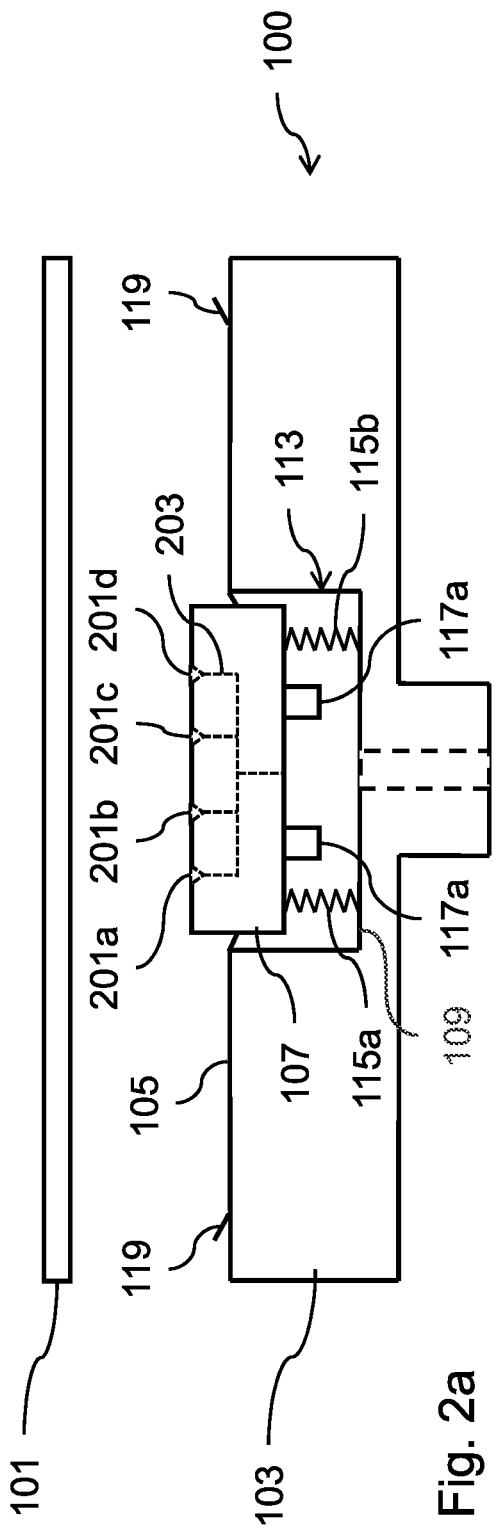

FIG. 2*a* shows the holding apparatus 100 in the loading position prior to placement of the substrate 101.

The vertically movable carrier element 107 is raised by the compression springs 115*a-b* and is urged against a stop, not shown.

A first negative pressure P1 is applied to the cavity 113, thus producing a low vacuum in the cavity 113. The resulting force is too small in order to compress the compression springs 115*a-b* so that the carrier element 107 continues to lie against the stop and protrude beyond the upper side 105 of the main body 103.

Moreover, by reason of the fluidic connection of the suction openings 201*a*, 201*b*, 201*c*, 201*d* to the cavity 113 air can be drawn into the cavity 113 which, in addition, can prevent an excessively strong vacuum from being produced in the cavity 113.

Figure 2B:
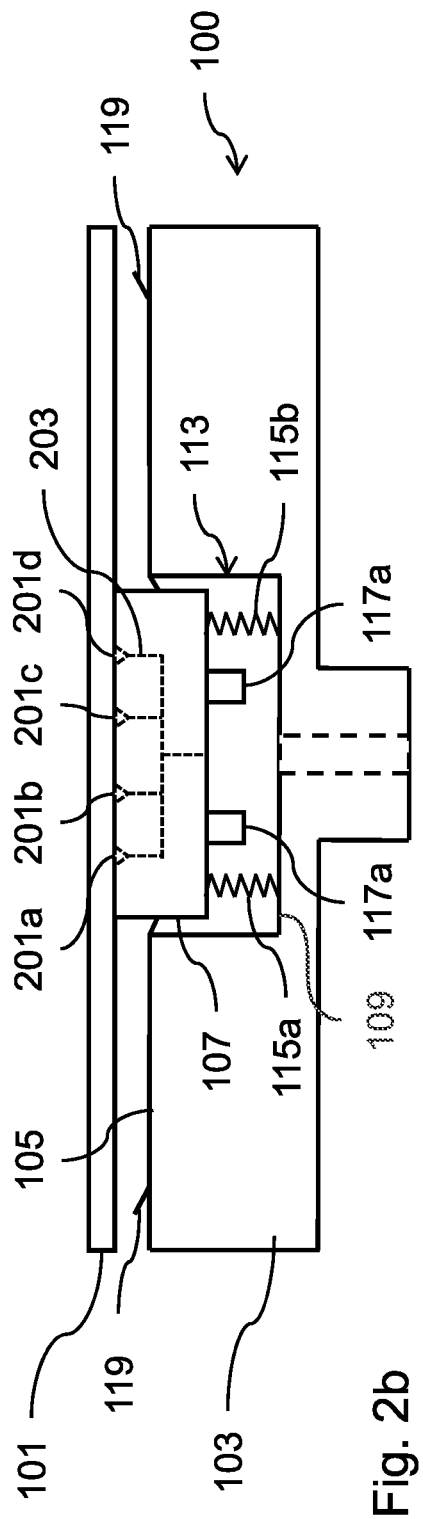

FIG. 2*b* shows the substrate 101 being placed onto the support surface 111 of carrier element 107.

Suction is applied to the substrate 101 through the suction openings 201*a*, 201*b*, 201*c*, 201*d* on the support surface 111 and the substrate is fixed thereon. At the same time, the substrate 101 covers the suction openings 201*a*, 201*b*, 201*c*, 201*d*.

Covering the suction openings 201*a*, 201*b*, 201*c*, 201*d* prevents e.g. air from the surrounding area entering into the cavity 113. This can effect an additional pressure reduction in the cavity 113 in which a second negative pressure P2 is thus present, wherein P2<P1.

In an alternative embodiment, the second negative pressure P2 can also be adjusted manually after the substrate 101 has been placed, e.g. by means of a pressure connection on the chuck 100.

FIG. 2*c* shows the carrier element 107 being lowered to the clamping position after placement of the substrate 101.

The carrier element 107 is lowered by reason of the pressure reduction in the cavity 113. The pulling force exerted upon the carrier element 107 by the negative pressure P2 in the cavity 113 outweighs the pushing force exerted by the clamping elements 115*a*, 115*b* upon the carrier element 107. As a consequence, the clamping elements 115*a*, 115*b* are compressed.

The carrier element 107 is lowered into the recess 109 to such an extent that the support surface 111 is arranged approximately flush with the upper side 105 of the main body 103, and the substrate 101 lies not only on the support surface 111 but also on the upper side 105. The maximum lowering depth of the carrier element 107 is determined by the spacers 117*a*, 117*b*.

The support surface 111 and the upper side 105 form, in the clamping position, a common clamping surface for the substrate 101. In the embodiment shown in FIG. 2*a*-FIG. 2*d*, the diameter of the main body 103 corresponds to the diameter of the substrate so that the substrate is supported with its complete rear side on the upper side 105 and the support surface 111.

Alternatively, the main body 103 can also have a larger diameter than the substrate or, as shown in FIG. 1, can have a smaller diameter than the substrate 101. Therefore, the holding apparatus 100 can also be used for particularly small or particularly large substrates 101.

FIG. 2 shows the substrate 101 being treated after the carrier element 107 has been lowered.

During the treatment, the substrate 101 is rotated, e.g. by a rotating apparatus, not shown, which causes the main body 103 and the carrier element 107 to rotate.

To this end, the main body 103 can be mounted in a rotatable manner in a rigid holding element of the holding apparatus 100. In particular, the holding apparatus 100 is designed as a spin chuck.

In addition to the suction openings 201*a*, 201*b*, 201*c*, 201*d* shown in FIG. 2*a*-FIG. 2*d*, the main body 103 can have further fixing means for fixing or clamping the lowered substrate 101 on the upper side 105. The further fixing means can comprise further suction openings.

Furthermore, FIG. 2*d* shows an application apparatus 205, by means of which a fluid can be applied to the rotating substrate. The fluid is e.g. a lacquer, in particular a photoresist, a coating liquid, a cleaning liquid or a solvent.

In an alternative embodiment, the sealing means 119 shown in FIG. 2*a*-FIG. 2*d*, e.g. a sealing lip, can be omitted. In the clamping position, the substrate 101 then comes directly into contact with the upper side 105 of the main body 103. This provides the advantage that maintenance outlay is reduced because the sealing lips no longer have to be regularly replaced and the sealing lips no longer have to be cleaned. Furthermore, possible floating of the substrate 101 as it is being deposited on the sealing lips is avoided.

Furthermore, the movable carrier element 100 can replace lifting pins for transferring the substrate 101 to an end effector, as used in known chucks. In order to deposit the substrate on the holding apparatus 100 or in order to then pick it up from the holding apparatus 100, the carrier element 107 can raise the substrate which means that no additional lifting pins are required.

In an alternative embodiment, the main body 103 comprises further application openings and/or nozzles for fluids which are arranged e.g. on the upper side 105 of the main body.

By means of these further application openings on the upper side 105, a fluid can be applied to a rear side of the substrate 101 if, as shown in FIG. 2b, the holding apparatus 100 is located in the loading position and the substrate 101 is supported on the carrier element 107.

The fluid can be applied to a surface on the rear side of the substrate 101 which is not covered by the carrier element 107. This provides the advantage that coating or cleaning or solvent treatment of the substrate rear side is permitted without the substrate 101 having to be lifted from the holding apparatus 100 and turned.

FIG. 3 shows a manufacturing equipment 300 for microstructure devices comprising a holding apparatus 100 according to one embodiment.

The manufacturing equipment 300 can be a coater, a lacquerer, a developer, a spin dryer, a mask aligner, a projection scanner, a laser stepper, a wafer bonder, a photomask system, a cleaning system or an imprint system.

The holding apparatus 100 can correspond to the holding apparatus 100 shown in FIG. 1 and/or FIG. 2a-FIG. 2d. The holding apparatus 100 can be connected to a pressure supply of the manufacturing equipment 300.

Furthermore, FIG. 3 shows a robot arm 301 comprising an end effector 303, on which a substrate 101 is supported. By means of this robot arm 301, the substrate 101 can be placed onto the holding apparatus 100, wherein the carrier element is raised during placement of the substrate 101.

Figure 4:
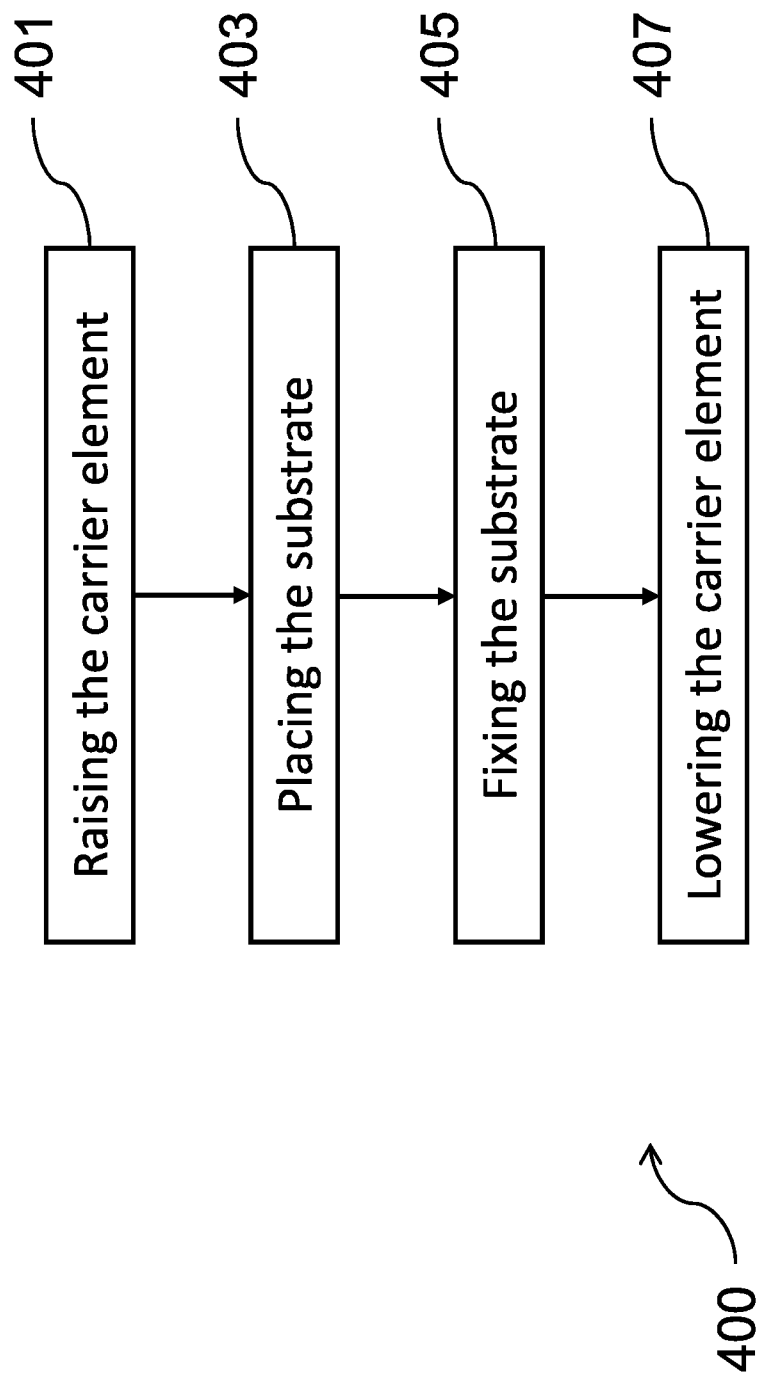
FIG. 4 shows a flow diagram of a method for holding a substrate in a holding apparatus.

FIG. 4 shows a flow diagram of a method 400 for holding the substrate 101 in the holding apparatus 100 according to one embodiment.

The substrate 101 can be a glass or semiconductor substrate. Furthermore, the substrate 101 can be a wafer or a mask. The substrate 101 can correspond to the substrate 101 shown in FIG. 1, FIG. 2a-FIG. 2d and/or FIG. 3.

The method 400 can be performed with the holding apparatus 100 of FIG. 1 and/or FIG. 2a-FIG. 2d, and comprises raising 401 the carrier element 107 to the loading position, wherein the carrier element 107 has a smaller diameter than the substrate 100, placing 403 the substrate 101 onto the support surface 111 of the carrier element 107, fixing 405 the substrate 101 on the support surface 111, and lowering 407 the carrier element 107 to the clamping position.

In the clamping position, the support surface 111 of the carrier element 107 is arranged substantially flush with the upper side 105 of the main body 103.

The substrate 101 can have a bow or deformation or can be very flexible. The bowed substrate 101 can be a so-called warped wafer.

The smaller diameter of the carrier element 107 in comparison with the substrate 101 ensures that suction can be applied more easily in particular to bowed substrates 101 than with a large-surface chuck because the size of the vacuum surface underneath the substrate 101 is smaller.

According to one embodiment, in order to fix 405 the substrate 101 on the support surface 111 a first negative pressure is applied to the cavity 113 of the holding apparatus 100, and in order to lower the carrier element 107 to the clamping position a second negative pressure is applied to the cavity 113, wherein the second negative pressure is a lower pressure than the first negative pressure.

The application of the negative pressure to the cavity 113 causes a pulling force to be produced which counteracts a pushing force of the lifting element. The lifting element is adjusted in such a manner that the pulling force exerted upon the carrier element 107 exceeds the pushing force of the lifting element during application of the second negative pressure. As a consequence, the carrier element 107 is lowered.

The negative pressure can be applied via an external pressure supply to a pressure connection of the holding apparatus.

In an alternative embodiment, in order to fix 405 the substrate on the support surface 111 the first negative pressure is applied to the cavity 113 of the holding apparatus 100, and the second negative pressure is applied in the cavity 113 after the substrate 101 is placed onto the carrier element 107, e.g. by the covering of suction openings 201a-d on the support surface 111 by the substrate 101.

In the clamping position, the substrate 101 can be additionally pulled and/or fixed against the upper side 105 of the main body 103 by a negative pressure acting between the substrate 101 and the upper side 105.

According to one embodiment, the carrier element 107 can urge a bowed or deformed substrate 101 in the clamping position against an upper side 105 of the main body 103 such that a force exerted upon the substrate 101 is so great that the bowing or deformation of the substrate 101 is reduced.

The substrate can be smoothed out and/or clamped by means of the force exerted in this manner.

Furthermore, the method 400 can comprise rotating the substrate 101, in particular after lowering 407 the carrier element 107 to the clamping position.

After lowering the substrate 101, the substrate 101 can be processed or treated, e.g. a coating can be applied to the rotating substrate.

The lowering 407 of the substrate 101 can be performed a predetermined time after placing 403 the substrate 101 or immediately after placing the substrate 101, e.g. depending upon pre-set process parameters.

In a manufacturing equipment 300, the mode of operation of the holding apparatus 100 is controlled e.g. by means of a process module.

When transferring a warped wafer from a substrate handler (robot, axle with end effector, etc.) to the holding apparatus 100, the process module signals e.g. to a substrate handler the reception of the substrate on the "Z-chuck" (carrier element 107) which has been lifted out, whereupon the holding vacuum is deactivated on the substrate handler. Therefore, a transfer error from the substrate handler to the holding apparatus 100 can be minimised.

As the carrier element 107 with the bowed substrate 101 is being lowered, the substrate is centred and guided. Lateral slippage or floating is no longer possible. A sealing lip 119 in the outer region of the holding apparatus 100, e.g. on the upper side 105 of the main body 105, can come into contact with the substrate 101 during the lowering procedure so that a large-surface vacuum is established underneath the substrate and the substrate 101 is pulled two-dimensionally in a planar manner.

The invention claimed is:

1. A holding apparatus for a substrate, comprising:
a main body comprising an upper side,
a carrier element, wherein the carrier element is arranged in a recess of the main body so as to be vertically movable, wherein the carrier element is adjustable between a protruding loading position and a retracted clamping position, and wherein the carrier element comprises a support surface for placement of the substrate, wherein the support surface has a smaller diameter than the main body, and
a lifting element which raises the carrier element to the loading position,
wherein the carrier element seals the recess such that a sealed cavity is provided between the main body and the carrier element, which cavity can have a negative pressure applied thereto which counteracts the effect of the lifting element,
wherein spacers are provided which define the retracted clamping position of the carrier element in which the support surface of the carrier element is arranged flush with the upper side of the main body, and
wherein the spacers are arranged in parallel to the lifting element.

2. The holding apparatus of claim 1 wherein the main body has a sealing means which surrounds the carrier element with a spaced interval and can seal between the upper side of the main body and the substrate.

3. The holding apparatus as of claim 1 wherein the carrier element is provided with a seal which seals against the lateral wall of the recess in the main body.

4. The holding apparatus of claim 1 wherein the carrier element comprises fixing means for fixing the substrate supported on the support surface.

5. The holding apparatus of claim 4 wherein the cavity and the fixing means are fluidically connected.

6. The holding apparatus of claim 1 wherein the holding apparatus comprises a pressure connection, whereby the pressure in the cavity is controllable.

7. The holding apparatus of claim 1 wherein the lifting element comprises a clamping element which is configured to exert a force upon the carrier element in order to raise it.

8. The holding apparatus of claim 1 wherein the holding apparatus comprises a rotating apparatus for rotating the holding apparatus.

9. A manufacturing equipment for microstructure devices which comprises a holding apparatus for a substrate, comprising:
a main body comprising an upper side,
a carrier element, wherein the carrier element is arranged in a recess of the main body so as to be vertically movable, wherein the carrier element is adjustable between a protruding loading position and a retracted clamping position, and wherein the carrier element comprises a support surface for placement of the substrate, wherein the support surface has a smaller diameter than the main body, and
a lifting element which raises the carrier element to the loading position,
wherein the carrier element seals the recess such that a sealed cavity is provided between the main body and the carrier element, which cavity can have a negative pressure applied thereto which counteracts the effect of the lifting element,
wherein spacers are provided which define the retracted clamping position of the carrier element in which the support surface of the carrier element is arranged flush with the upper side of the main body, and
wherein the spacers are co-planar with the lifting element.

10. A holding apparatus for a substrate, comprising:
a main body comprising an upper side,
a carrier element, wherein the carrier element is arranged in a recess of the main body so as to be vertically movable, wherein the carrier element is adjustable between a protruding loading position and a retracted clamping position, and wherein the carrier element comprises a support surface for placement of the substrate, wherein the support surface has a smaller diameter than the main body, and
a lifting element which raises the carrier element to the loading position,
wherein the carrier element seals the recess such that a sealed cavity is provided between the main body and the carrier element, which cavity can have a negative pressure applied thereto which counteracts the effect of the lifting element,
wherein spacers are provided which define the retracted clamping position of the carrier element in which the support surface of the carrier element is arranged flush with the upper side of the main body, and
wherein the spacers are spaced apart from said springs and located between the springs located at the bottom surface of the carrier element within the recess of the body.

11. A holding apparatus for a substrate, comprising:
a main body comprising an upper side,
a carrier element, wherein the carrier element is arranged in a recess of the main body so as to be vertically movable, wherein the carrier element is adjustable between a protruding loading position and a retracted clamping position, and wherein the carrier element comprises a support surface for placement of the substrate, wherein the support surface has a smaller diameter than the main body, and
a lifting element which raises the carrier element to the loading position,
wherein the carrier element seals the recess such that a sealed cavity is provided between the main body and the carrier element, which cavity can have a negative pressure applied thereto which counteracts the effect of the lifting element,
wherein spacers are provided which define the retracted clamping position of the carrier element in which the support surface of the carrier element is arranged flush with the upper side of the main body, and
wherein the carrier element comprises fixing means for fixing the substrate supported on the support surface and the cavity and the fixing means are fluidically connected.

12. A holding apparatus for a substrate, comprising:
a main body comprising an upper side,
a carrier element, wherein the carrier element is arranged in a recess of the main body so as to be vertically movable, wherein the carrier element is adjustable between a protruding loading position and a retracted clamping position, and wherein the carrier element comprises a support surface for placement of the substrate, wherein the support surface has a smaller diameter than the main body, and
a lifting element which raises the carrier element to the loading position,
wherein the carrier element seals the recess such that a sealed cavity is provided between the main body and the carrier element, which cavity can have a negative pressure applied thereto which counteracts the effect of the lifting element, wherein spacers are provided which define the retracted clamping position of the carrier element in which the support surface of the carrier element is arranged flush with the upper side of the main body, and wherein the holding apparatus comprises a rotating apparatus for rotating the holding apparatus.

* * * * *